United States Patent
Cha et al.

(10) Patent No.: US 9,190,605 B2
(45) Date of Patent: Nov. 17, 2015

(54) NANOPIEZOELECTRIC GENERATOR AND METHOD OF MANUFACTURING THE SAME

(75) Inventors: Seung-nam Cha, Seoul (KR); Sung-min Kim, Seoul (KR); Jung-inn Sohn, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 245 days.

(21) Appl. No.: 13/561,509

(22) Filed: Jul. 30, 2012

(65) Prior Publication Data

US 2013/0175901 A1 Jul. 11, 2013

(30) Foreign Application Priority Data

Jan. 10, 2012 (KR) ........................ 10-2012-0003078

(51) Int. Cl.
| | |
|---|---|
| *H01L 41/113* | (2006.01) |
| *H01L 41/29* | (2013.01) |
| *H01L 41/18* | (2006.01) |
| *H01L 41/253* | (2013.01) |

(52) U.S. Cl.
CPC .............. *H01L 41/29* (2013.01); *H01L 41/113* (2013.01); *H01L 41/18* (2013.01); *H01L 41/253* (2013.01)

(58) Field of Classification Search
USPC ......................................... 310/339, 340, 358
See application file for complete search history.

(56) References Cited

U.S. PATENT DOCUMENTS

| | | | | |
|---|---|---|---|---|
| 3,394,081 | A * | 7/1968 | King et al. ...................... | 117/72 |
| 2003/0186522 | A1* | 10/2003 | Duan et al. .................... | 438/584 |
| 2010/0253184 | A1 | 10/2010 | Choi et al. | |
| 2011/0204317 | A1* | 8/2011 | Park et al. ......................... | 257/9 |
| 2013/0260113 | A1* | 10/2013 | Hart ............................... | 428/201 |

FOREIGN PATENT DOCUMENTS

| | | |
|---|---|---|
| GB | 2469869 A | 11/2010 |
| JP | 2010-153791 A | 7/2010 |
| KR | 10-0616733 B1 | 8/2006 |
| KR | 10-0634512 B1 | 10/2006 |
| KR | 10-0851281 B1 | 8/2008 |
| WO | 2008/085886 A2 | 7/2008 |

OTHER PUBLICATIONS

Communication dated May 30, 2014 issued by the European Patent Office in counterpart European Application No. 13150772.5.

Zhong Lin Wang "ZnO nanowire and nanobelt platform for nanotechnology", Materials Science and Engineering R, vol. 64, No. 3-4, Apr. 3, 2009, 39 pgs. total, XP026027229.

Sheng Xu et al., "Piezoelectric-nanowire-enabled power source for driving wireless microelectronics", Nature Communications, Oct. 19, 2010, 5 pages total, www.nature.com/naturecommunication, DOI: 10.1038/ncomms1098.

* cited by examiner

*Primary Examiner* — Thomas Dougherty
(74) *Attorney, Agent, or Firm* — Sughrue Mion, PLLC

(57) ABSTRACT

A nanopiezoelectric generator is provided. The nanopiezoelectric generator includes a first electrode; a second electrode; at least one nanostructure that is interposed between the first electrode and the second electrode, and includes a piezoelectric material and first carriers; and a concentration adjusting unit that adjusts a concentration of the first carriers in the at least one nanostructure.

8 Claims, 10 Drawing Sheets

+ VOLTAGE

NANOPIEZOELECTRIC GENERATOR AND METHOD OF MANUFACTURING THE SAME

CROSS-REFERENCE TO RELATED APPLICATIONS

This application claims the benefit of Korean Patent Application No. 10-2012-0003078, filed on Jan. 10, 2012 in the Korean Intellectual Property Office, the disclosure of which is incorporated herein in its entirety by reference.

BACKGROUND

1. Field

The present disclosure relates to nanopiezoelectric generators and methods of manufacturing the same.

2. Description of the Related Art

Piezoelectric generators that convert mechanical vibration into electrical energy may be used as power supplies for small devices and sensors or as mechanical vibration sensors.

Nanopiezotronics, which is piezoelectricity on a nanoscopic scale, has been recently studied. Piezoelectric efficiency in a nanostructure is higher than piezoelectric efficiency in a bulk structure as a result of strain confinement. In a bulk structure, strain caused by a stress occurs not only in a direction in which the stress is applied but also in directions in which the stress is not applied, whereas in a nanostructure, particularly, in a nanowire that is a one-dimensional (1D) nanostructure, strain is limited to a longitudinal direction of the nanowire in which a stress is applied, thereby leading to a high piezoelectric coefficient.

Since well-known piezoelectric materials such as lead zirconate titanate (PZT) or barium titanium oxide (BTO) are harmful to the human body and since it is difficult to synthesize a nanowire by using such well-known piezoelectric material, a material such as ZnO or GaN, from which a nanowire may be easily synthesized, has recently been actively studied as new nanopiezoelectric materials.

SUMMARY

Provided herein are nanopiezoelectric generators having improved piezoelectric efficiency and methods of manufacturing the same.

According to an aspect of an embodiment, there is provided a nanopiezoelectric generator including: a first electrode and a second electrode; at least one nanostructure that is formed between the first electrode and the second electrode, and includes a piezoelectric material and first carriers; and a concentration adjusting unit that adjusts a concentration of the first carriers.

The at least one nanostructure may include ZnO or GaN.

At least one of the first electrode and the second electrode may include a silicon substrate having an electrical resistance equal to or less than $10^{-3}$ ohm·cm.

The concentration adjusting unit may include second carriers that are doped into the at least one nanostructure and have a polarity opposite to a polarity of the first carriers. The at least one nanostructure may be a ZnO semiconductor nanowire, and the second carriers may be p-type impurities. The p-type impurities may be lithium (Li).

The concentration adjusting unit may include a functional group that is attached to a surface of the at least one nanostructure and bears an electric charge having the same polarity as a polarity of the first carriers. The at least one nanostructure may be a ZnO semiconductor nanowire, and the functional group may be negatively charged.

The concentration adjusting unit may include a ferroelectric material coated on a surface of the at least one nanostructure.

The nanopiezoelectric generator may further include a substrate, wherein the substrate may be a plastic substrate or a fabric substrate.

The at least one nanostructure may have a cross-sectional shape having a diameter equal to or less than 1 μm.

According to an aspect of another embodiment, there is provided a nanopiezoelectric generator including: a first electrode and a second electrode; and at least one nanostructure that is formed between the first electrode and the second electrode, and includes a semiconductor piezoelectric material and first carriers, wherein a concentration of the first carriers is equal to or less than $10^{15}/cm^3$.

According to an aspect of another embodiment, there is provided a method of manufacturing a nanopiezoelectric generator, the method including: forming on a first electrode at least one nanostructure that is formed of a piezoelectric material and includes first carriers therein; and adjusting a concentration of the first carriers in the at least one nanostructure.

The first electrode may include a silicon substrate having an electrical resistance equal to or less than $10^{-3}$ ohm·cm.

The adjusting of the concentration of the first carriers may include doping second carriers that have a polarity opposite to a polarity of the first carriers when the at least one nanostructure is formed. The at least one nanostructure may be a ZnO semiconductor nanowire, wherein the second carriers may be p-type impurities. The p-type impurities may be lithium (Li).

The adjusting of the concentration of the first carriers may also include attaching to a surface of the at least one nanostructure a functional group that bears electric charge having the same polarity as a polarity of the first carriers. The at least one nanostructure may be a ZnO semiconductor nanowire, wherein the functional group may be negatively charged.

The adjusting of the concentration of the first carriers may include coating a ferroelectric material on a surface of the at least one nanostructure.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Figure 1:
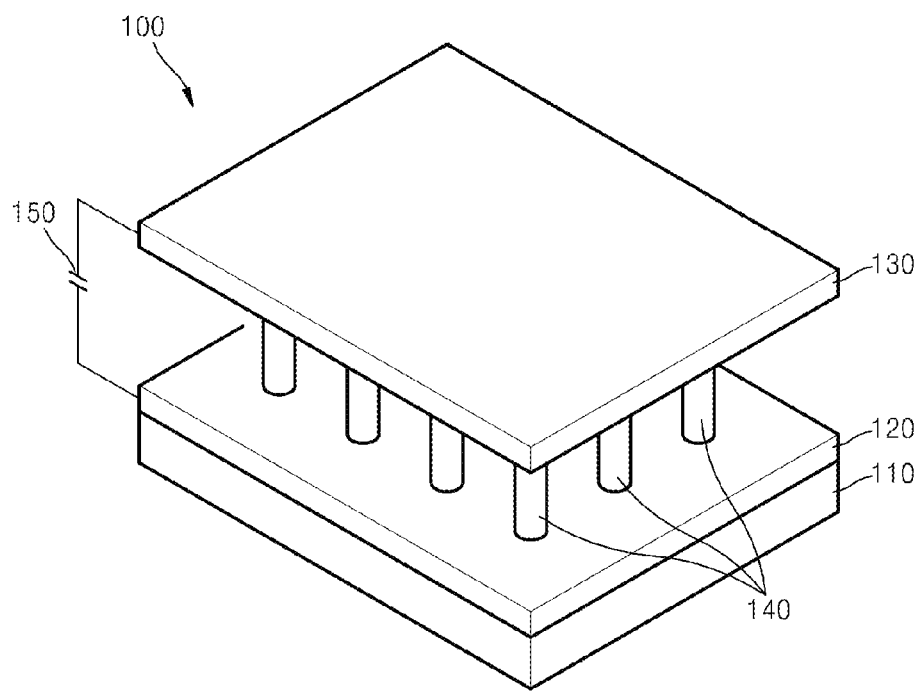
FIG. 1 is a perspective view illustrating a nanopiezoelectric generator according to an embodiment.

Exemplary embodiments will now be described more fully with reference to the accompanying drawings. In the drawings, the same reference numerals denote the same elements, and sizes of the elements may be exaggerated for clarity and convenience.

Figure 2:
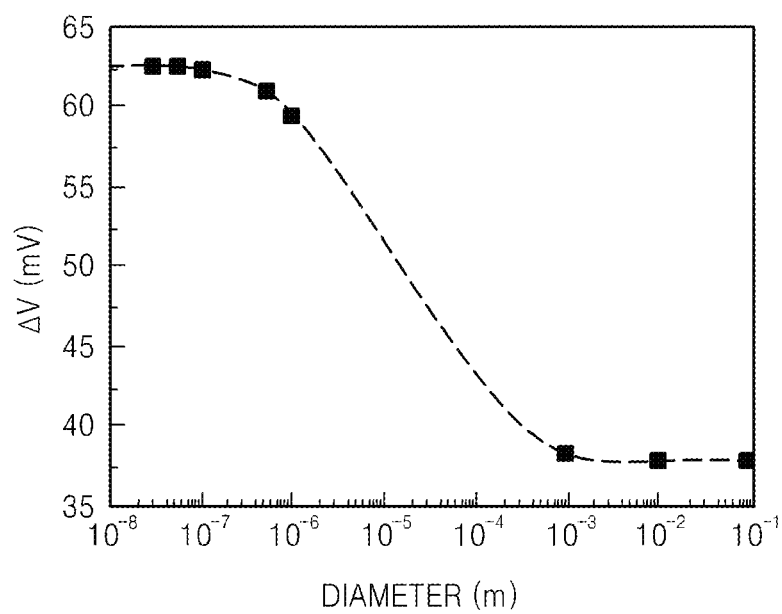
FIG. 2 is a graph illustrating a relationship between a piezoelectric potential and a diameter of a ZnO nanowire.
Figure 3:
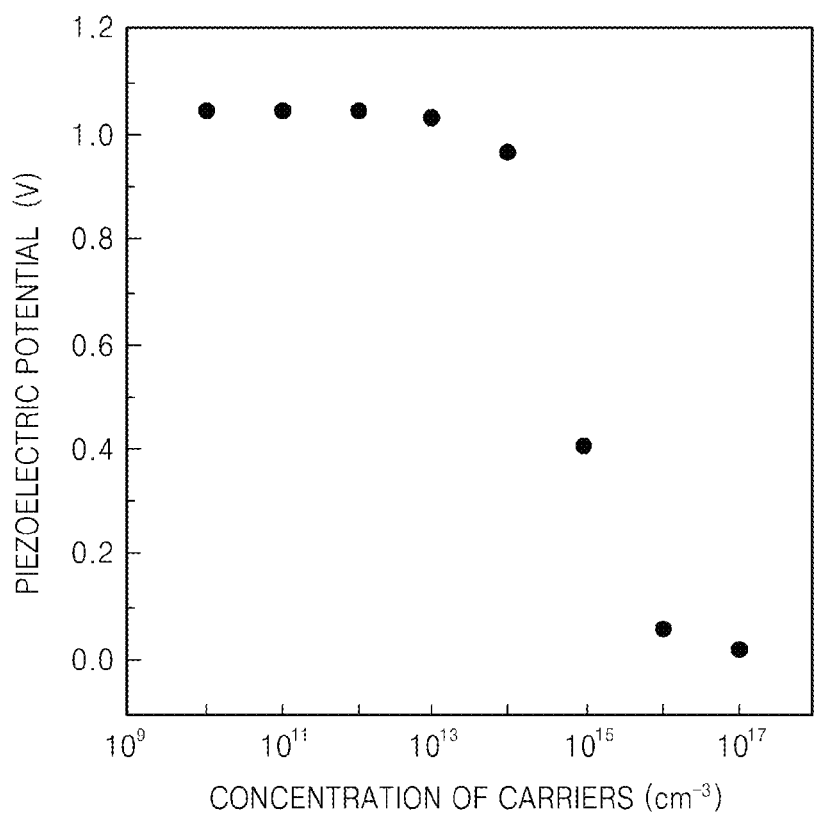
FIG. 3 is a graph of computer simulation illustrating a relationship between a piezoelectric potential and a concentration of carriers in a ZnO nanowire.

FIG. 1 is a perspective view illustrating a nanopiezoelectric generator 100 according to an embodiment. FIG. 2 is a graph illustrating a relationship between a piezoelectric potential and a diameter of a ZnO nanowire. FIG. 3 is a graph of computer simulation illustrating a relationship between a piezoelectric potential and a concentration of carriers in a ZnO nanowire.

Referring to FIG. 1, the nanopiezoelectric generator 100 includes a first electrode 130, a second electrode 120, at least one nanostructure 140 that is formed between the first electrode 130 and the second electrode 120, is formed of a piezoelectric material, and includes first carriers therein, and a concentration adjusting unit that adjusts a concentration of the first carriers.

Any one of the first electrode 130 and the second electrode 120, for example, the second electrode 120, may include a silicon substrate having an electrical resistance equal to or less than $10^{-3}$ ohm·cm.

Also, as shown in FIG. 1, the nanopiezoelectric generator 100 may further include a substrate 110. The substrate 110 may be formed from any of various materials. For example, the substrate 110 may be a solid substrate, such as a silicon substrate or a glass substrate. Alternatively, the substrate 110 may be a flexible substrate, such as a fabric substrate or a plastic substrate, but the present embodiment is not limited thereto.

Each of the first electrode 130 and the second electrode 120 may be formed from, for example, gold (Au), silver (Ag), aluminum (Al), copper (Cu), palladium (Pd), platinum (Pt), ruthenium (Ru), or a combination or alloys thereof. Alternatively, each of the first electrode 130 and the second electrode 120 may be formed from indium tin oxide (ITO), carbon nanotubes, a conductive polymer, a nanofiber, a nanocomposite, or graphene, but the present embodiment is not limited thereto. If the substrate 110 includes a conductive material, the substrate 110 may function as an electrode instead of the second electrode 120. For example, if the substrate 110 includes heavily doped silicon, the second electrode 120 may not be provided on the substrate 110.

The at least one nanostructure 140 may be provided between the first and second electrodes 130 and 120, and may improve piezoelectric efficiency as a result of its nano scale. Examples of the nanostructure may include a nanorod, a nanowire, a nanopore, and a nanotube, but the present embodiment is not limited thereto. Also, the nanostructure 140 may have any of various cross-sectional shapes such as a hexagonal cross-sectional shape or a square cross-sectional shape. Also, the nanostructure 140 may have a cross-sectional shape whose size varies along a growth axis like a nanoneedle. As mentioned previously, a nanostructure may have a higher piezoelectric efficiency than a bulk structure as a result of strain confinement. In a bulk structure, strain caused by a stress occurs not only in the direction in which the stress is applied but also in directions in which the stress is not applied, whereas in a nanostructure, particularly in a nanowire that is a one-dimensional (1D) nanostructure, strain is limited to the longitudinal direction of the nanowire in which a stress is applied, thereby leading to a high piezoelectric coefficient.

The graph in FIG. 2 illustrates the relationship between a piezoelectric potential $\Delta V$ and the diameter of a ZnO nanowire having a length of 600 nm when a stress of $10^7$ N/m$^2$ is applied. Referring to FIG. 2, the piezoelectric potential $\Delta V$ increases as the diameter of the ZnO nanowire decreases.

The nanostructure 140 has a potential that is generated according to the sum of vectors of electric dipoles induced to the growth axis as a result of strain. Since a ZnO nanowire has a growth axis in a direction of [0001], a potential is generated according to the sum of vectors of electric dipoles resulting from strain occurring in the direction Referring to FIG. 2, a diameter of the nanostructure 140 may be determined to be equal to or less than about 1 μm.

The nanostructure 140 may be arranged in a two-dimensional (2D) array on the second electrode 120. That is, one nanostructure 140 may be provided on the second electrode 120, or a plurality of the nanostructures 140 may be regularly or irregularly arranged at predetermined intervals on the second electrode 120. Also, the nanostructure 140 may be arranged perpendicularly to the substrate 110 or obliquely at a predetermined angle with respect to the substrate 110.

The nanostructure 140 may include a piezoelectric material having semiconductor properties. First carriers may be included in the nanostructure 140. For example, the first carriers may be n-type impurities or p-type impurities. The nanostructure 140 may include, for example, ZnO or GaN. It is easier to synthesize a nanowire using a piezoelectric material such as ZnO or GaN than it is using lead zirconate titanate (PZT) or barium titanium oxide (BTO), which are well-known piezoelectric materials. In particular, since a ZnO nanowire is not harmful to the human body and may be synthesized by using various and easy methods, research is being actively conducted regarding the use of ZnO as a piezoelectric material. However, ZnO has lower piezoelectric efficiency than other materials because of piezoelectric potential screening due to charge carriers in ZnO. The graph of FIG. 3 illustrates a result of a computer simulation. A ZnO nanowire is formed to have a hexagonal cylindrical shape having a diameter of 200 nm and a length of 200 nm. Here, the diameter refers to a longest diagonal length of the hexagonal shape. A bottom surface of the ZnO nanowire is adhered to a substrate and electrically grounded, and an external stress Tz of $10^7$ N/m$^2$ is applied from a top surface of the ZnO nanowire in a longitudinal direction of the ZnO nanowire. An induced piezoelectric potential is calculated as a function of a concentration at the center of the top surface of the ZnO nanowire. Referring to FIG. 3, the piezoelectric potential decreases as the concentration of carriers increases, and the piezoelectric potential dramatically falls when the concentration of the carriers is greater than about $10^{15}$/cm$^3$.

Accordingly, in order to improve piezoelectric efficiency, the nanopiezoelectric generator 100 may include a concentration adjusting unit for controlling the concentration of the first carriers in the nanostructure 140, and thus the concentration of the first carriers in the nanostructure 140 may be adjusted to be equal to or less than about $10^{15}$/cm$^3$. For example, the concentration of the first carriers in the nanostructure 140 may be adjusted to be equal to or less than about $10^{14}$/cm$^3$ or may be adjusted to be equal to or less than about $10^{13}$/cm$^3$. The detailed examples of the concentration adjusting unit will be explained later.

An external load 150 may be connected to the first and second electrodes 130 and 120 and may store or consume electricity generated by the nanopiezoelectric generator 100.

For example, if the external load 150 is a capacitor, electricity generated by the nanopiezoelectric generator 100 may be stored in the capacitor. Also, if the external load 150 is a nano device, electricity generated by the nanopiezoelectric generator 100 may be consumed by the nano device.

A mechanical force or energy, such as microvibration, wind, sound, or body motion, may be applied from the outside to the nanopiezoelectric generator 100. Once an external force is applied to the nanopiezoelectric generator 100, the nanostructure 140 provided on the substrate 110 may be deformed. Also, when the external force is no longer applied to the nanopiezoelectric generator 100, the nanostructure 140 may return to its original shape. As such, due to its piezoelectric properties, the nanostructure 140 which is deformed and returns to its original shape may induce a predetermined voltage between the first and second electrodes 130 and 120 connected to both ends of the nanostructure 140. Accordingly, the nanostructure 100 may convert mechanical energy into electrical energy.

The concentration adjusting unit for controlling a concentration of the first carriers in the nanostructure 140 will be explained below.

The concentration adjusting unit may include second carriers that are doped into the nanostructure 140 and have a polarity opposite to a polarity of the first carriers.

For example, the nanostructure 140 may be a ZnO nanowire, and in this case, the nanostructure 140 may be an n-type nanostructure. Accordingly, the second carriers may be p-type impurities. The p-type impurities may be, for example, lithium (Li).

Figure 4:
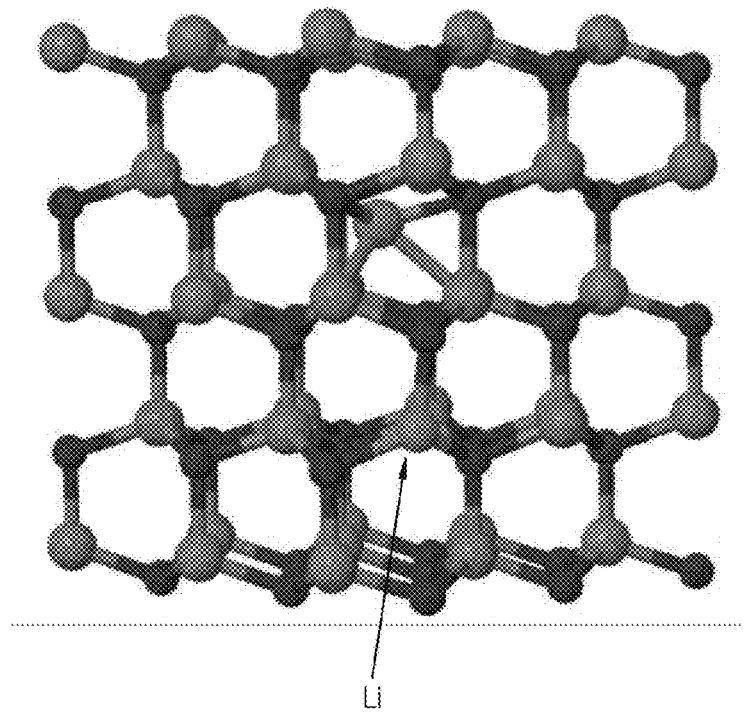
FIG. 4 is an image illustrating a case where lithium (Li) is doped into a ZnO nanowire.

FIG. 4 is an image illustrating a case where Li is doped into a ZnO nanowire. The larger balls represent zinc (Zn), the smaller balls represent oxygen (O), and the small ball in the lower central portion of the Figure represents Li. In particular, FIG. 4 a structure sin which Li displaces Zn in a ZnO structure.

Figure 5:
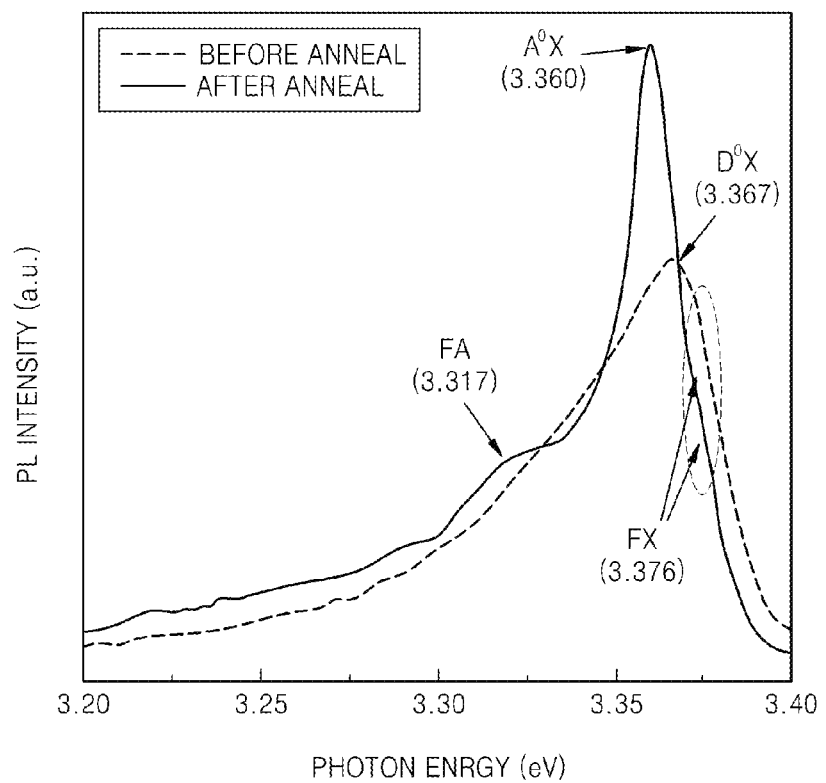
FIG. 5 is a graph illustrating a low-temperature photoluminescence (PL) intensity of a ZnO nanowire into which Li is doped.

FIG. 5 is a graph illustrating a low-temperature photoluminescence (PL) intensity of a ZnO nanowire into which Li is doped. FIG. 5 illustrates PL intensities before annealing and after annealing when Li is applied as p-type impurities to a ZnO nanowire that is an n-type nanowire. Before the annealing, Li is mostly interstitial and the Li does not displace Zn. After the annealing, however, Li is combined with O and acts as an impurity. Accordingly, a peak AX appearing after the annealing indicates that the ZnO nanowire is well doped with p-type impurities. Herein, the term doping refers to a process of adding impurities and performing annealing.

Figure 6:
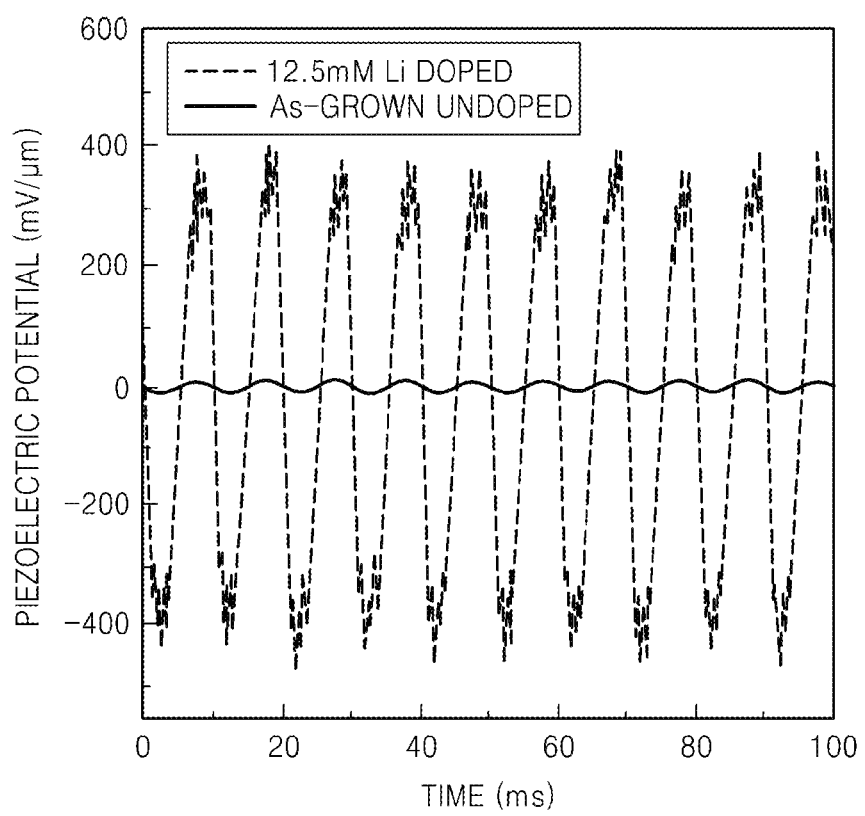
FIG. 6 is a graph illustrating piezoelectric potentials of a ZnO nanowire into which Li is doped and an as-grown nanowire.

FIG. 6 is a graph illustrating piezoelectric potentials of a ZnO nanowire into which Li is doped and an as-grown nanowire. The ZnO nanowire into which Li is doped has a higher piezoelectric potential than the as-grown nanowire into which p-type impurities are not doped.

Also, the concentration adjusting unit may include a functional group that is attached to a surface of the nanostructure 140 and bears an electric charge having the same polarity as a polarity of the first carriers.

Figure 7A:
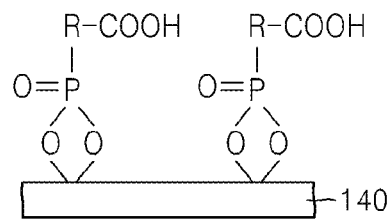
FIGS. 7A, 7B and 7C illustrate an example where a functional group is attached to a surface of a nanostructure.
Figure 7B:
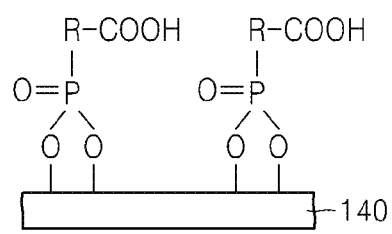
Figure 7C:
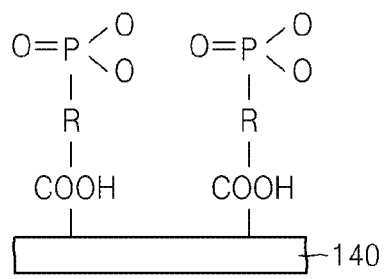

FIGS. 7A, 7B and 7C illustrate an example where a functional group is attached to a surface of the nanostructure 140. As shown in FIGS. 7A, 7B and 7C, the nanostructure 140 may be an n-type ZnO nanowire, and a carboxyl group may be attached as a functional group bearing negative charge to the surface of the nanostructure 140. The carboxyl group attached to the surface of the nanostructure 140 may deplete electric charge in the nanostructure 140.

Figure 8:
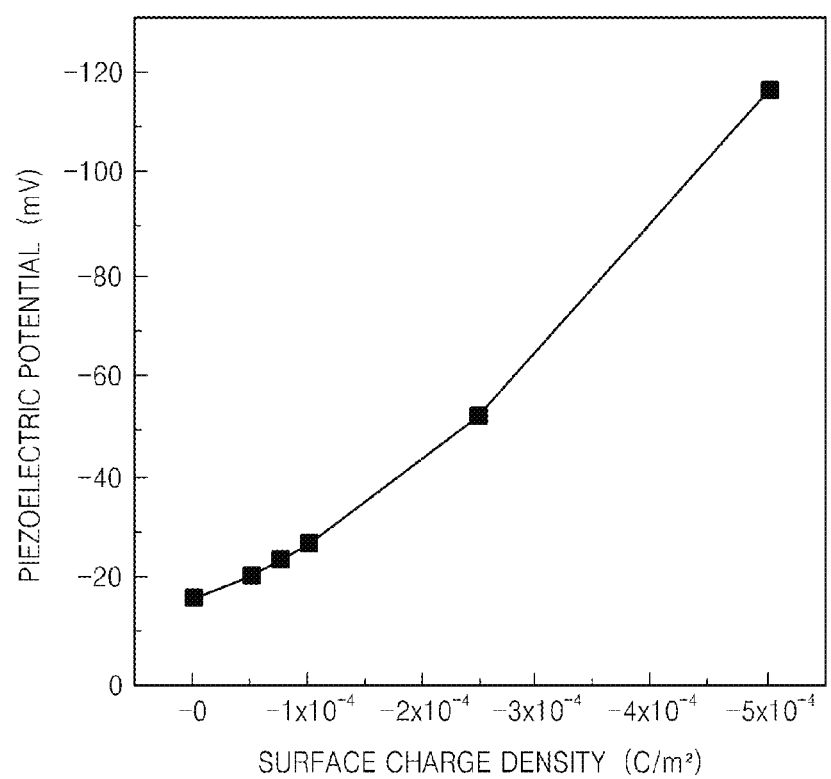
FIG. 8 is a graph of computer simulation illustrating a relationship between a piezoelectric potential and a surface charge density of a ZnO nanowire.

FIG. 8 is a graph of computer simulation illustrating a relationship between the piezoelectric potential and the surface charge density of a ZnO nanowire.

For the computation simulation, the ZnO nanowire is formed to have a cylindrical shape having a diameter of 100 nm and a length of 1 μm. A bottom surface of the ZnO nanowire is adhered to a substrate and electrically grounded, and an external stress Tz of $-1\times10^7$ N/m$^2$ is applied from a top surface of the ZnO nanowire in a longitudinal direction of the ZnO nanowire. An induced piezoelectric potential is calculated by using a function of a surface charge density at the center of the top surface of the ZnO nanowire. A piezoelectric potential increment $\phi_{piezo}$ induced by surface charge is calculated by subtracting a potential when no stress is applied from a potential when a stress is applied.

$$\phi_{piezo}=\phi(Tz=-1\times10^7)-\phi(Tz=0).$$

Referring to FIG. 8, the piezoelectric potential increases as the density of a negative charge formed on the surface increases. This means that since a functional group that is negatively charged is attached to a surface, the functional group depletes negative charge in the ZnO nanowire.

Figure 9:
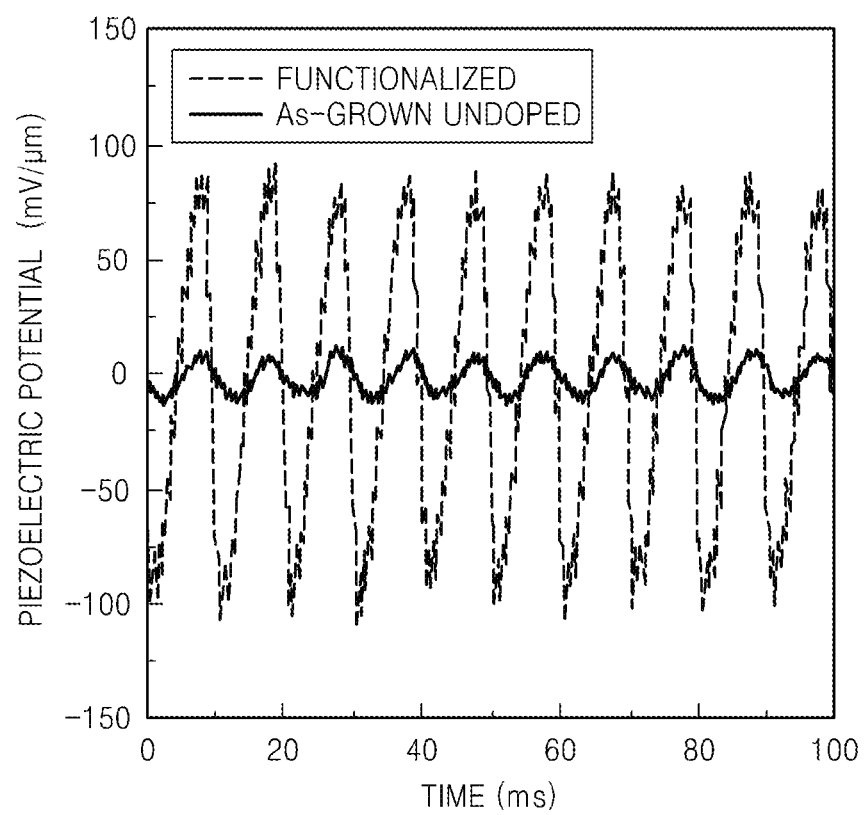
FIG. 9 is a graph illustrating piezoelectric potentials of a functionalized nanowire and an as-grown nanowire.

FIG. 9 is a graph illustrating piezoelectric potentials of a functionalized nanowire to a surface of which a functional group bearing negative charge is attached and an as-grown nanowire. The material used for functionalization of the embodiment reflected in FIG. 9 is oleic acid, but the present embodiment is not limited thereto. Any material may be used as long as the material includes a carboxyl group, for example, perfluorotetradecanoic acid. Referring to FIG. 9, the piezoelectric potential of the nanowire to which the functional group bearing the negative charge is attached is about 11 times higher than that of the as-grown nanowire.

Also, the concentration adjusting unit may include a ferroelectric material coated on a surface of the nanostructure 140. The ferroelectric material coated on the surface of the nanostructure 140 controls the charge density by aligning electric dipoles in one direction.

Figure 10:
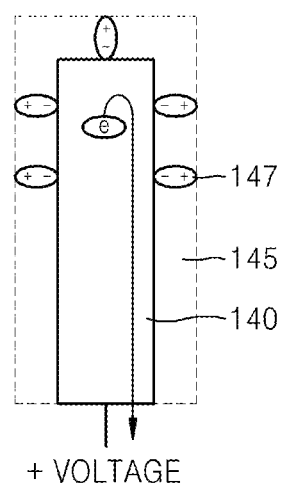
FIG. 10 is a conceptual view illustrating a case where the concentration of carriers in the nanostructure is controlled by coating a ferroelectric material on a surface of the nanostructure.

FIG. 10 is a conceptual view illustrating a case where the concentration of the first carriers in the nanostructure 140 is controlled by coating a ferroelectric material 145 on a surface of the nanostructure 140. As shown in FIG. 10, when the ferroelectric material 145 applies a positive (+) voltage to the nanostructure 140 that is a nanowire, a portion of the ferroelectric material 145 close to the nanostructure 140 is negatively charged and a portion of the ferroelectric material 145 far away from the nanostructure 140 is positively charged. As such, as electrical dipoles 147 of the ferroelectric material 145 are aligned, electrons in the nanostructure 140 drift to the outside due to a Coulomb force, thereby making it possible to control the concentration of the first carriers in the nanostructure 140. The ferroelectric material 145 may be polyvinylidene fluoride (PVDF), BTO, or PZT.

According to the one or more embodiments of the present invention, a nanopiezoelectric generator may improve piezoelectric efficiency by adjusting the concentration of carriers in a nanostructure.

A method of manufacturing a nanopiezoelectric generator may reduce the concentration of carriers in a nanostructure in various ways and thus provide a nanopiezoelectric generator having high piezoelectric efficiency.

While embodiments have been particularly shown and described with reference to examples, it will be understood by those of ordinary skill in the art that various changes in form and details may be made therein without departing from the spirit and scope of the present disclosure as defined by the following claims.

What is claimed is:
1. A nanopiezoelectric generator comprising:
a first electrode;

a second electrode;
at least one nanostructure that is interposed between the first electrode and the second electrode, the at least one nanostructure comprising a piezoelectric material and first carriers; and
a concentration adjusting unit, comprising a ferroelectric material disposed on a surface of the at least one nanostructure, wherein the ferroelectric material adjusts a concentration of the first carriers in the at least one nanostructure.

2. The nanopiezoelectric generator of claim 1, wherein the piezoelectric material comprises ZnO or GaN.

3. The nanopiezoelectric generator of claim 1, wherein at least one of the first electrode and the second electrode comprises a silicon substrate having an electrical resistance equal to or less than $10^{-3}$ ohm·cm.

4. A nanopiezoelectric generator comprising:
a first electrode;
a second electrode;
at least one nanostructure that is interposed between the first electrode and the second electrode, the at least one nanostructure comprising a piezoelectric material and first carriers; and
a concentration adjusting unit that adjusts a concentration of the first carriers in the at least one nanostructure, wherein the concentration adjusting unit comprises a functional group that is attached to a surface of the at least one nanostructure and bears an electric charge having a polarity that is the same as a polarity of the first carriers,
wherein a first end of the at least one nanostructure, along a longitudinal direction of the at least one nanostructure, is in contact with the first electrode, a second end of the at least one nanostructure, along the longitudinal direction of the at least one nanostructure, is in contact with the second electrode, and the surface to which the functional group is attached is not in contact with the first electrode or the second electrode.

5. The nanopiezoelectric generator of claim 4, wherein the at least one nanostructure is a ZnO semiconductor nanowire, and the functional group is negatively charged.

6. The nanopiezoelectric generator of claim 1, further comprising a substrate on which the second electrode is disposed, wherein the substrate is a plastic substrate or a fabric substrate.

7. The nanopiezoelectric generator of claim 1, wherein the at least one nanostructure has a cross-sectional shape having a diameter equal to or less than 1 µm.

8. The nanopiezoelectric generator of claim 1,
wherein the concentration adjusting unit adjusts the concentration of the first carriers in the at least one nanostructure to equal to or less than $10^{15}/cm^3$.

* * * * *